United States Patent
Zhang

(10) Patent No.: US 7,310,039 B1
(45) Date of Patent: Dec. 18, 2007

(54) SURFACE INDUCTOR

(75) Inventor: Ligang Zhang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 797 days.

(21) Appl. No.: 09/997,378

(22) Filed: Nov. 30, 2001

(51) Int. Cl.
*H01F 5/00* (2006.01)

(52) U.S. Cl. .................................... 336/200

(58) Field of Classification Search ............... 336/65, 336/83, 192, 200, 232; 257/531
See application file for complete search history.

(56) References Cited

U.S. PATENT DOCUMENTS

| | | | |
|---|---|---|---|
| 3,988,665 A * | 10/1976 | Neumaier et al. ......... 324/240 |
| 5,083,236 A | 1/1992 | Chason et al. | |
| 5,446,311 A | 8/1995 | Ewen et al. | |
| 5,459,368 A | 10/1995 | Onishi et al. | |
| 5,461,353 A | 10/1995 | Eberhardt | |
| 5,559,360 A | 9/1996 | Chiu et al. | |
| 5,760,456 A | 6/1998 | Grzegorek et al. | |
| 5,793,272 A | 8/1998 | Burghartz et al. | |
| 5,884,990 A | 3/1999 | Burghartz et al. | |
| 5,918,121 A | 6/1999 | Wen et al. | |
| 5,959,515 A | 9/1999 | Cornett et al. | |
| 5,959,522 A | 9/1999 | Andrews | |
| 6,008,102 A | 12/1999 | Alford et al. | |
| 6,037,649 A | 3/2000 | Liou | |
| 6,046,109 A | 4/2000 | Liao et al. | |
| 6,054,329 A | 4/2000 | Burghartz et al. | |
| 6,114,937 A | 9/2000 | Burghartz et al. | |
| 6,124,624 A | 9/2000 | Van Roosmalen et al. | |
| 6,146,958 A | 11/2000 | Zhao et al. | |
| 6,153,489 A | 11/2000 | Park et al. | |
| 6,169,008 B1 | 1/2001 | Wen et al. | |
| 6,218,729 B1 | 4/2001 | Zavrel, Jr. et al. | |
| 6,362,525 B1 | 3/2002 | Rahim | |

(Continued)

FOREIGN PATENT DOCUMENTS

EP   0 675 539 A2   10/1995

(Continued)

OTHER PUBLICATIONS

Frommberger, Michael, et al., "Integration of Crossed Anisotropy Magnetic Core Into Toroidal Thin-Film Inductors", IEEE Transactions on Microwave Theory and Techniques, vol. 53, No. 6, Jun. 2005, pp. 2096-2100l, no date.

(Continued)

*Primary Examiner*—Tuyen T. Nguyen
(74) *Attorney, Agent, or Firm*—Zagorin O'Brien Graham LLP

(57) ABSTRACT

It has been discovered that an inductor may be made to include a surface rotational portion instead of a coil to provide a low inductance inductor with sufficient quality factor. The surface rotational portion is a conducting structure which is substantially enclosed along the length of the structure and which has openings at each end of the structure and an opening along the length of the structure between the end openings. One example of such a structure is a cylinder having a lateral opening and openings at its ends or bases. Another example of such a structure is a duct-shape or rectangular structure. Any appropriately shaped surface may be used to rotate current, and varying thicknesses and lengths may be used as appropriate.

25 Claims, 2 Drawing Sheets

U.S. PATENT DOCUMENTS

| | | | |
|---|---|---|---|
| 6,373,369 | B2 | 4/2002 | Huang et al. |
| 6,389,691 | B1 | 5/2002 | Rinne et al. |
| 6,486,534 | B1 | 11/2002 | Sridharan et al. |
| 6,501,169 | B1 | 12/2002 | Aoki et al. |
| 6,534,843 | B2 | 3/2003 | Acosta et al. |
| 6,600,208 | B2 | 7/2003 | Brennan et al. |
| 6,847,282 | B2 | 1/2005 | Gomez et al. |
| 6,873,065 | B2 | 3/2005 | Haigh et al. |
| 2001/0013821 | A1 | 8/2001 | Huang et al. |
| 2002/0109204 | A1 | 8/2002 | Acosta et al. |
| 2002/0140081 | A1 | 10/2002 | Chou et al. |

FOREIGN PATENT DOCUMENTS

| | | | |
|---|---|---|---|
| JP | 62-241311 | * | 10/1987 |
| JP | 06-053042 | * | 2/1994 |

OTHER PUBLICATIONS

Kim, Sung-Jin, et al., "Realization of High-Q Inductors Using Wirebonding Technology ", School of Electronics engineering, Ajou University, AP-ASIG Proceedings, Aug. 1994, 4 pages, no date.

Long, John R. and Miles A. Copeland, "The Modeling, Characterization, and Design of Monolithic Inductors for Silicon RF IC 's, "IEEE Journal of Solid-State Circuits, vol. 32, No. 3, Mar. 1997, pp. 357-369, no date.

Soh, H. T., et al., "Through-Wafer Vias (TWV) and their Applications in 3 Dimensional Structures" , Proceedings of 1998 International Conference on Solid State Devices and Materials, Sep. 1998, 12 pages, no date.

Tang, Chih-Chun, et al. "Miniature 3-D Inductors in Standard CMOS Process ", IEEE Journal of Solid-State Circuits, vol. 37, No. 4, Apr. 2002, pp. 471-480 no date.

Tsui, Hau-Yiu and Jack Lau, 2003 IEEE MTT-S Digest, pp. 225-228, no month.

Wu, Joyce H., et al., "A tThrough-Wafer Interconnect in Silicon for RFICs" IEEE Transactions on Electron Devices, vol. 51, No. 11, Nov. 2004, pp. 1765-1771, no date.

Zannoth, Markus, et al., "A Fully Integrated VCO at 2 GHz ", IEEE Journal of Solid-State Circuits, vol. 33, No. 12, Dec. 1998, pp. 1987-1991, no date.

Zou, Jun, et al., Development of Vertical Planar Coil Inductors Using Plastic Deformation Magnetic Assembly (PDMA), 2001 IEEE International Microwave Symposium, May 2001, 4 pages, no date.

* cited by examiner

SURFACE INDUCTOR

BACKGROUND

1. Field

The present invention relates to inductors, and, more particularly, to structures and methods for generating an inductance in a circuit.

2. Description of the Related Art

Classical inductors typically include an input, an output and a coil disposed therebetween through which current rotates. The width of each coil turn is typically equal to the thickness of the coil turn. In an integrated circuit, the width of each coil turn is typically equal to the thickness of the available metal layers. There has been an increasing need to design a small inductor with a good quality factor (Q). This need is especially pronounced in high frequency voltage controlled oscillator (VCO) designs. However, such inductors have been very difficult to design given modern integrated circuit design restrictions. Traditionally, inductors are designed to be metal traces forming various loops. One limitation on this type of inductor is that as the inductance value L decreases, its quality factor Q tends to get smaller as well. This makes small inductors less useful in high-frequency, low-loss VCO designs.

One resolution of this problem is to place multiple inductors in parallel to reduce the effective inductance. For example, when two identical inductors are placed in parallel, the effective inductance $L_{eff}$ of the parallel inductors is the combined inductance $L_c$ of each inductor plus the mutual inductance M between the inductors divided by two.

$$L_{eff} = \frac{L_c + M}{2}$$

If the parallel inductors are placed too close together, M is substantially equal to $L_c$ ($M \approx L_c$), and there is little or no inductance reduction at all. If the inductors are placed sufficiently far away from each other, $M \approx 0$. In this case, $$L_{eff} = \frac{L_c}{2}.$$

However, sufficient isolation is difficult to obtain. Also, there is a limit on the number of inductors that can be placed together in parallel given the fact that their mutual inductances need to be small to get effective inductance reduction. Thus, there is a need for a new inductor and method for generating an inductance, e.g., to generate a small inductance L with sufficient quality factor Q.

SUMMARY

It has been discovered that an inductor may be made to include a surface rotational portion instead of a coil. In one embodiment, a surface rotational portion has a length that is substantially equal to the length of the inductor and is substantially larger than the thickness of the surface rotational portion. The exemplary surface rotational portion is a conducting structure which is substantially enclosed along the length of the structure and which has openings at each end of the structure and an opening along the length of the structure between the end openings. One example of such a structure is a cylinder having a lateral opening and openings at its ends or bases. Another example of such a structure is a duct-shape or rectangular structure. Any appropriately shaped surface may be used to rotate current, and varying thicknesses and lengths may be used such that the length of the surface rotational portion is substantially larger than the thickness of the surface rotational portion as taught herein.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may become apparent in the detailed description set forth below.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DESCRIPTION OF THE PREFERRED EMBODIMENT(S)

The following discussion is intended to provide a detailed description of at least one example or embodiment of the invention and should not be taken to be limiting of the invention itself. Rather, any number of variations may fall within the scope of the invention which is properly defined in the claims following this description.

Figure 1:
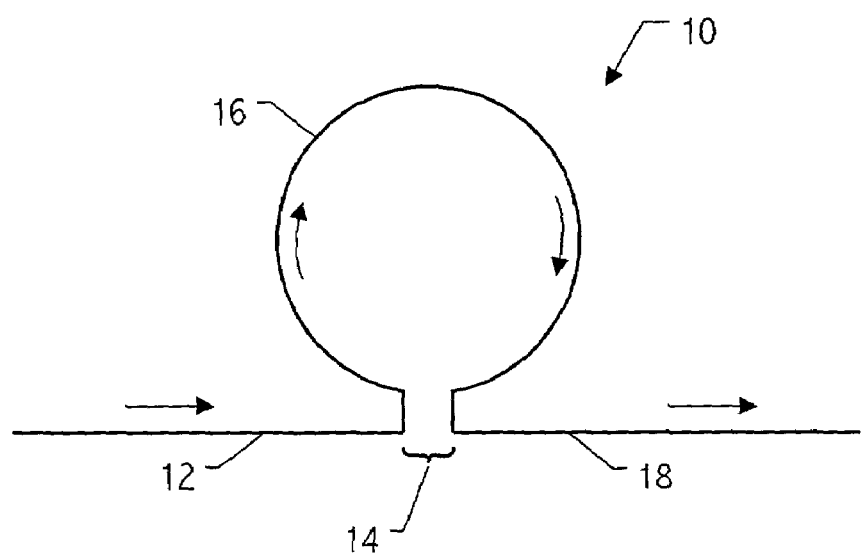
FIG. 1 is a cutaway view of a cylinder inductance structure.

FIG. 1 shows an inductor 10. Inductor 10 includes input 12 and output 18. Rotational portion 16 is coupled between input 12 and output 18. Arrows on FIG. 1 show a current flow entering input 12, rotating in a clockwise direction through rotational portion 16, and exiting inductor 10 at output 18. As shown, inductor 10 is electrically symmetrical with respect to current, and input 12 may act as an output, and output 18 may act as an input.

Figure 2:
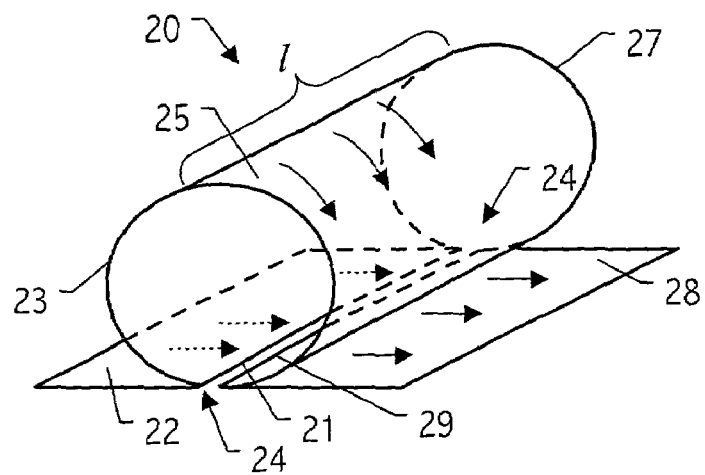
FIG. 2 is a perspective view of a cylinder inductance structure.

FIG. 2 shows a perspective view of inductor 20. Inductor 20 includes input 22 and output 28. Input 22 and output 28 are surface I/O nodes which are distributed over or continuously cover a particular area to facilitate a free flow of current (e.g., with relatively low resistance) into and out of the inductor 20. As shown, inductor 20 is electrically symmetrical and surface input 22 may act as an output, and surface output 28 may act as an input. Rotational portion 25 is coupled between input 22 and output 28. The length of the surface rotational portion measured from base end 23 to base end 27 is equal to the length of the inductor. Rotational portion 25 includes side edge 21 and side edge 29. Side edges 21 and 29 are substantially parallel to each other and define an opening or space 24 in rotational portion 25.

Rotational portion 25 is a surface rotational portion of length 1. For example, as shown, the surface rotational portion has a curved surface of a certain thickness which is used in place of a traditional coil of a classical inductor. Varying thicknesses and lengths may be used such that the length of the surface rotational portion is substantially larger than the thickness of the surface rotational portion wherein the direction of the thickness is perpendicular to the surface area where the thickness is measured. For example, in one embodiment, the ratio of length to thickness is 100:1 to achieve a desired quality factor and inductance. In this embodiment, the length of the surface rotational portion (and the inductor) is equal to 100 microns whereas the thickness of the surface rotational portion is equal to 1 micron. However, other ratios which provide a "substantially larger" length may be used such as ratios of 50:1 or 500:1 depending on design requirements in specific cases. Some embodiments may use surface rotational portions having length-to-thickness ratios of as low as 5:1 or length-to-thickness ratios as high as 1000:1 or even much higher.

In the embodiment shown in FIG. 2, current enters inductor 20 at surface input 22, rotates in a clockwise direction around rotational portion 25 from side input edge 21 towards side output edge 29, and then exits inductor 20 via surface output 28, as shown by the current arrows.

In this embodiment, surface input 22 is a surface which has a characteristic surface area and appropriate thickness. In other embodiments, other types of distributed inputs may be used such as multiple instances of more traditional vias which may be connected to points which are, for example, evenly distributed along side input edge 21. Similarly, the shown embodiment includes surface output 22 having a characteristic surface area and appropriate thickness. In other embodiments, other types of distributed outputs may be used such as multiple instances of more traditional vias which may be connected to points which are, for example, evenly distributed along side output edge 29. Other types of inputs and outputs may be used, including strictly traditional, single via inputs. For example, more traditional vias may be coupled to inductor 20 near base input edge 23 and base output edge 27, respectively. Other couplings may occur near the middle of inductor 20 or another appropriate location.

Figure 3:
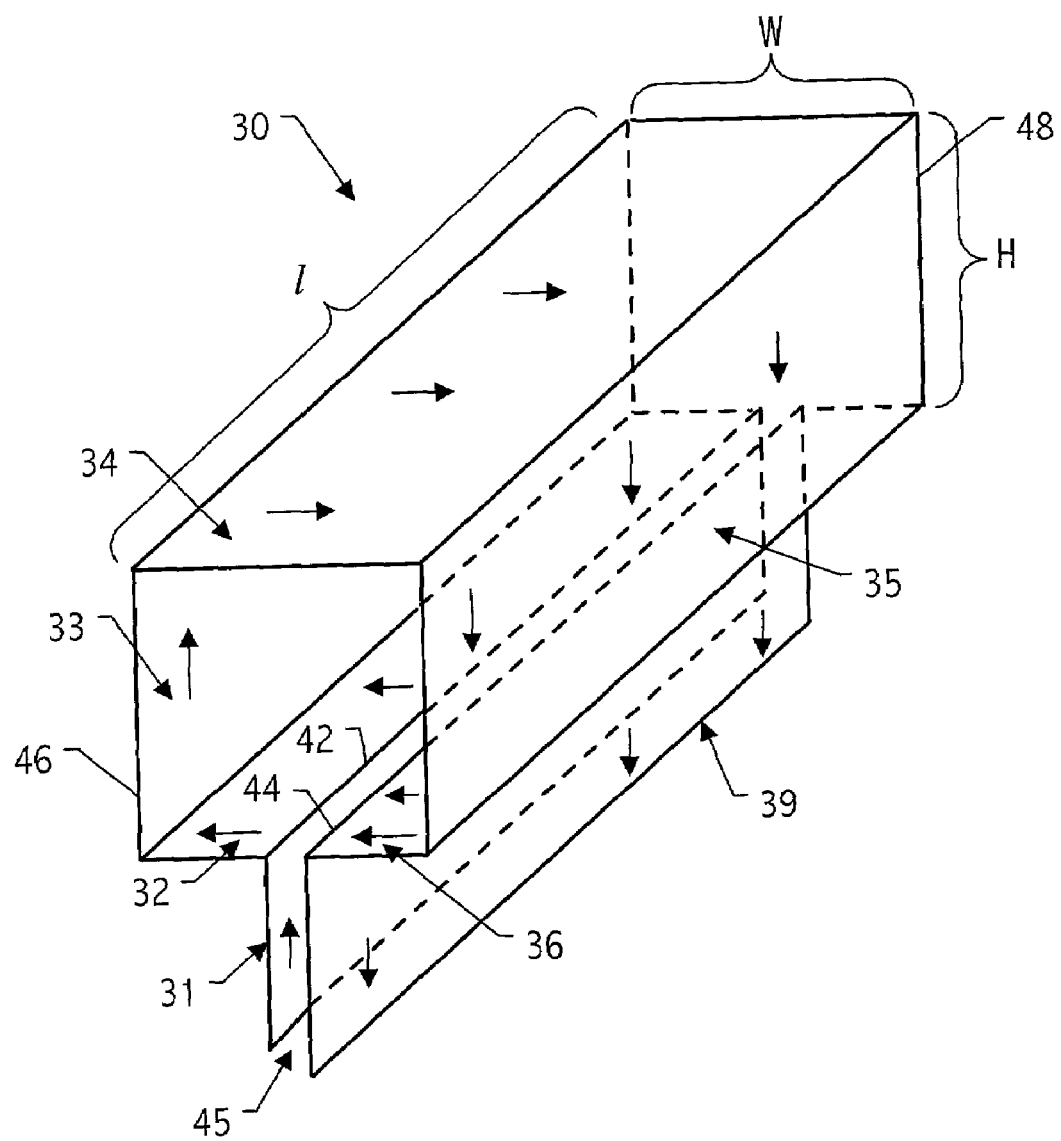
FIG. 3 is a perspective view of a duct-shaped inductance structure.

FIG. 3 shows a perspective view of inductor 30 which may, for example, be embedded in an integrated circuit. Inductor 30 is a duct-like structure which may be easier to form given the design restrictions of many semiconductor processes and integrated circuits.

As shown in FIG. 3, inductor 30 includes surface input 31 and surface output 39. As shown, inductor 30 is electrically symmetrical and input 31 may act as an output, and output 39 may act as an input. As discussed above with reference to FIG. 2, the I/O nodes 31 and 39 may take any of a variety of different forms.

A surface rotational portion is coupled between input 31 and output 39. The rotational portion is used in place of a traditional coil of a classical inductor. The rotational portion includes substantially planar sides 32, 33, 34, 35 and 36. Side 32 has an edge which is coupled to side 33, which in turn has an edge coupled to side 34, which in turn has an edge coupled to side 35, which in turn has an edge coupled to side 36. Side 32 includes side edge 42, and side 36 includes side edge 44. Side edges 42 and 44 of the rotational portion are substantially parallel to each other and define an opening or space 45 in the rotational portion. Side edges 42 and 44 need not be located in the center of a side of the inductor as shown in FIG. 3, and may be located at a corner in which case the rotational portion has only four substantially planar sides.

As shown in FIG. 3 by the current arrows, current enters inductor 30 at surface input 31. The current rotates, here in a clockwise direction, around the rotational portion sides from side input edge 42 towards side output edge 44, first through side 32, then through side 33, then through side 34, then through side 35, then through side 36. The current then flows from side 36 through side output edge 44 and exits inductor 30 via surface output 39. As demonstrated in FIG. 3, the described current rotation need not be circular or elliptical in nature, and may occur over any type of curve.

Sides 32, 33, 34, 35 and 36 may be continuous surfaces as shown in FIG. 3. However, the sides of inductor 30 may be formed in other ways to approximate the performance of continuous surfaces. For example, some integrated circuit manufacturing techniques may form vertical sides 33 and 35 as multiple, parallel, vertical, solid cylinders (e.g., vias) of conductive material such as metal. In this case, each cylinder would include an input base end coupled to receive current from the preceding side (e.g., input base ends of cylinders of side 33 from preceding side 32) and an output base end to provide current to a next side (e.g., from cylinders of side 33 to next side 34). The same applies to other vertical surfaces such as inputs 31 and 39. Other semiconductor manufacturing limitations or adaptations for convenience may result in other modifications being made to the surface rotational portion without deviating from the spirit of the claimed invention.

When the length l or 1 of the inductance structure or inductor is larger to much larger than the width W and the height H (and/or, the radius of the base, the area of the base, or other similar base measurement), the inductance L of the inductor is approximately as follows:

$$L \propto \frac{WH}{l}$$

Therefore, as the length l of the inductor increases, the inductance L of the inductor will decrease, and the loop resistance will also decrease. Therefore, the quality factor Q does not degrade as the inductance decreases. This property makes this inductance structure particularly suitable for high frequency, low phase noise VCO designs, among others. Notwithstanding, the length of the inductor may be on the same order of magnitude as the height and width, and still provide a surface inductor. For example, although the length of the inductor may be substantially larger than the height of the inductor in some embodiments, or the same as the height in other embodiments, some embodiments may include a surface rotational portion having a length that is one-half the height, for example, but still substantially larger than the thickness of the surface rotational portion.

Also, by applying capacitance and amplification across the side space (e.g., space 45) along the length of a surface inductor between the inductor's side edges, the surface inductor may be used as part of an LC oscillator. Distributed, alternating capacitors and amplifiers may be attached in parallel across the side space, for example. This case demonstrates that surface inputs 31 and 39 are optional. That is, circuit components may be coupled directly to side edges 42 and 44. For example, amplifiers and capacitors may be coupled in space 45 between edges 42 and 44, and in such a case, the current is generated by the amplifiers in space 45.

Thus, a novel inductance structure is taught herein which includes a surface rotational portion instead of a coil. The surface rotational portion is a conducting structure which is substantially enclosed along the length of the structure and which has openings at each end of the structure and an opening along the length of the structure between the end openings. For example, the surface rotational portion may be any surface formed by a line or curve moving in parallel or around a central axis line at a fixed or varying distance therefrom. In one embodiment, a metal or other conducting material cylinder or tube may be used, as is shown in FIGS. 1 and 2. Generally, a cylinder is a surface generated by a family of all lines parallel to a given line (the generatrix) and passing through a curve in a plane (the directrix). A right section is the curve formed by the intersection of the surface and a plane perpendicular to the generatrix. The parallel bases of a cylinder may form any angle with the axis. In the case of "cylindrical" embodiments described herein, the cylinder may be circular, noncircular, right or oblique, and the radius of a cylinder or the area enclosed by the sides of the rotational surface on a plane crossing such sides need not be constant over the length of the inductor. Thus, in one embodiment all right sections of the inductor define the same area; and, in another embodiment the areas of different right sections may vary. In another embodiment, a duct-shape inductance structure may be used, as is shown in FIG. 3. In this case, the directrix is square or rectangular to take advantage of certain integrated circuit and semiconductor processing requirements. Other shapes may be used for the directrix. Thus, any appropriate shapes may be used, of varying and appropriate thickness and length, as long as the appropriate inductance and quality factor are maintained for the application in question.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

The above description is intended to describe at least one embodiment of the invention. The above description is not intended to define the scope of the invention. While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. An inductor comprising a surface rotational portion, the surface rotational portion including first and second base edges,
   wherein the surface rotational portion has a length measured from the first base edge to the second base edge, the length being substantially larger than a thickness of the surface rotational portion, and
   wherein the surface rotational portion comprises a plurality of substantially flat sides.

2. The inductor of claim 1 wherein the length of surface rotational portion is of substantially the same order of magnitude as each of the height and width of the surface rotational portion.

3. The inductor of claim 1 wherein the length of surface rotational portion is substantially larger than each of the height and width of the surface rotational portion.

4. The inductor of claim 1, further comprising:
   an input node coupled to a first side edge of the surface rotational portion, the first side edge extending along the length of the inductor from a first base end of the inductor to a second base end of the inductor;
   an output node coupled to a second side edge of the surface rotational portion, the second side edge extending along the length of the inductor from a first base end of the inductor to a second base end of the inductor, the first and second side edges being at opposite ends of the surface rotational portion.

5. The inductor of claim 4 wherein the input and output nodes are surface nodes.

6. The inductor of claim 1, wherein the surface rotational portion is substantially electrically symmetrical with respect to current.

7. The inductor of claim 1, wherein the surface rotational portion is formed to guide current flow in one loop.

8. The inductor of claim 1, wherein the surface rotational portion is formed such that the surface rotational portion has a face which may be generated by a family of all lines parallel to a given generatrix line and passing through a directrix curve in a plane.

9. The inductor of claim 8, wherein the directrix curve is rectangular.

10. The inductor of claim 1, wherein the surface rotational portion is duct shaped.

11. The inductor of claim 1, wherein the plurality of substantially flat sides comprise:
 a first substantially flat side coupled to receive a current from an input node;
 a second substantially flat side coupled to receive the current from the first substantially flat side;
 a third substantially flat side coupled to receive the current from the second substantially flat side; and
 a fourth substantially flat side coupled to receive the current from the third substantially flat side and to provide the current to an output node.

12. The inductor of claim 11, wherein
 the first and third sides are substantially parallel; and
 the second and fourth sides are substantially parallel.

13. The inductor of claim 12, wherein the first side is substantially perpendicular to the second side.

14. The inductor of claim 1, wherein the plurality of substantially flat sides comprise:
 a first substantially flat side coupled to receive a current from an input node;
 a second substantially flat side coupled to receive the current from the first substantially flat side;
 a third substantially flat side coupled to receive the current from the second substantially flat side;
 a fourth substantially flat side coupled to receive the current from the third substantially flat side; and
 a fifth substantially flat side coupled to receive the current from the fourth substantially flat side and to provide the current to an output node.

15. The inductor of claim 14, wherein
 the first and third sides are substantially parallel;
 the second and fourth sides are substantially parallel; and
 the first side is substantially perpendicular to the second side.

16. The inductor of claim 15, wherein the first and fifth sides are in substantially the same plane.

17. The inductor of claim 15, wherein each of the second and fourth sides are vertical in an integrated circuit, and comprise a plurality of spaced, parallel, vertical cylinders.

18. The inductor of claim 1,
 wherein a first one of the plurality of substantially flat sides is coupled to receive a current from an input node, a second one of the plurality of substantially flat sides is coupled to provide a current to an output node, and the other ones of the plurality of substantially flat sides are coupled in series between the first and second ones of the plurality of substantially flat sides.

19. The inductor of claim 1, wherein the surface rotational portion has a face which may be generated by moving a curve around a central axis line at a distance from the central axis line.

20. The inductor of claim 19, wherein the distance has different values at different angular locations around the central axis line.

21. The inductor of claim 1 wherein a ratio of the length of the surface rotational portion to the thickness of the surface rotational portion is greater than 5:1.

22. The inductor of claim 21 wherein a ratio of the length of the surface rotational portion to the thickness of the surface rotational portion is in a range from 50:1 to 1000:1.

23. An integrated circuit comprising at least one inductor of claim 1.

24. An information processing system including an integrated circuit comprising at least one inductor of claim 1.

25. The inductor of claim 1 wherein the surface rotational portion is an electrical conductor.

* * * * *